United States Patent
Wunnicke et al.

(10) Patent No.: US 11,427,465 B2
(45) Date of Patent: Aug. 30, 2022

(54) CAPACITIVE SENSORS HAVING TEMPERATURE STABLE OUTPUT

(71) Applicant: Sciosense B.V., AE Eindhoven (NL)

(72) Inventors: Olaf Wunnicke, Eindhoven (NL); Frederik Willem Maurits Vanhelmont, Maaseik (BE); Willem Frederik Adrianus Besling, JN Eindhoven (NL); Remco Henricus Wilhelmus Pijnenburg, AE Hoogeloon (NL); Casper Van Der Avoort, Waalre (NL); Anderson Pires Singulani, Graz (AT); Martijn Goossens, AT Veldhoven (NL)

(73) Assignee: SCIOSENSE B.V., AE Eindhoven (NL)

( * ) Notice: Subject to any disclaimer, the term of this patent is extended or adjusted under 35 U.S.C. 154(b) by 158 days.

(21) Appl. No.: 17/043,397

(22) PCT Filed: Apr. 25, 2019

(86) PCT No.: PCT/EP2019/060675
§ 371 (c)(1),
(2) Date: Sep. 29, 2020

(87) PCT Pub. No.: WO2019/207072
PCT Pub. Date: Oct. 31, 2019

(65) Prior Publication Data
US 2021/0163282 A1 Jun. 3, 2021

Related U.S. Application Data

(60) Provisional application No. 62/756,725, filed on Nov. 7, 2018, provisional application No. 62/662,366, filed on Apr. 25, 2018.

(51) Int. Cl.
*B81B 7/00* (2006.01)
*G01L 9/00* (2006.01)
*G01L 9/12* (2006.01)

(52) U.S. Cl.
CPC .......... *B81B 7/0019* (2013.01); *B81B 7/0064* (2013.01); *G01L 9/0072* (2013.01);
(Continued)

(58) Field of Classification Search
None
See application file for complete search history.

(56) References Cited

U.S. PATENT DOCUMENTS

| 4,194,083 A | * | 3/1980 | Abe | H03K 17/98 |
| | | | | 341/5 |
| 6,686,638 B2 | * | 2/2004 | Fischer | G01P 15/0802 |
| | | | | 257/750 |
| 6,965,153 B1 | * | 11/2005 | Ono | H01J 37/3007 |
| | | | | 250/492.23 |
| 7,701,110 B2 | * | 4/2010 | Fukuda | B06B 1/0292 |
| | | | | 310/309 |

(Continued)

FOREIGN PATENT DOCUMENTS

| EP | 2674392 A1 | 12/2013 |
| EP | 2796844 A1 | 10/2014 |
| EP | 2806258 A1 | 11/2014 |

OTHER PUBLICATIONS

Machida, Shuntaro, "MEMS Technology Using Back-End of Line Processes in CMOS LSI," 2010 IEEE International Interconnect Technology Conference, Burlingame, CA, Jun. 6-9, 2010, 3 pages.

Primary Examiner — Peter J Macchiarolo
Assistant Examiner — Jermaine L Jenkins
(74) Attorney, Agent, or Firm — Slater Matsil, LLP

(57) ABSTRACT

In an embodiment a system includes a sensor including a base having a base electrode and a first membrane suspended above the base, wherein the first membrane has a first membrane electrode, wherein the first membrane is configured to deflect with respect to the base electrode in response to an environmental condition, and wherein the sensor is configured to measure a capacitance between the base electrode and the first membrane electrode. The system further includes a first device of the system configured to
(Continued)

generate electrical interference signals, a first electrically conductive shield layer positioned between the sensor and the first device of the system, wherein the first electrically conductive shield layer defines a plurality of first apertures extending through the first electrically conductive shield layer and a dielectric material disposed in the plurality of first apertures.

21 Claims, 13 Drawing Sheets

(52) U.S. Cl.
CPC ...... *G01L 9/125* (2013.01); *B81B 2201/0264* (2013.01); *B81B 2207/012* (2013.01)

(56) References Cited

U.S. PATENT DOCUMENTS

| | | | |
|---|---|---|---|
| 8,860,154 B2 * | 10/2014 | Wang | H04R 19/04 |
| | | | 257/419 |
| 9,340,412 B2 * | 5/2016 | Besling | H01L 29/84 |
| 9,463,975 B2 * | 10/2016 | Hong | B81C 1/00182 |
| 9,772,245 B2 * | 9/2017 | Besling | G01L 9/0041 |
| 10,060,817 B2 * | 8/2018 | Nackaerts | H01L 21/28 |

* cited by examiner

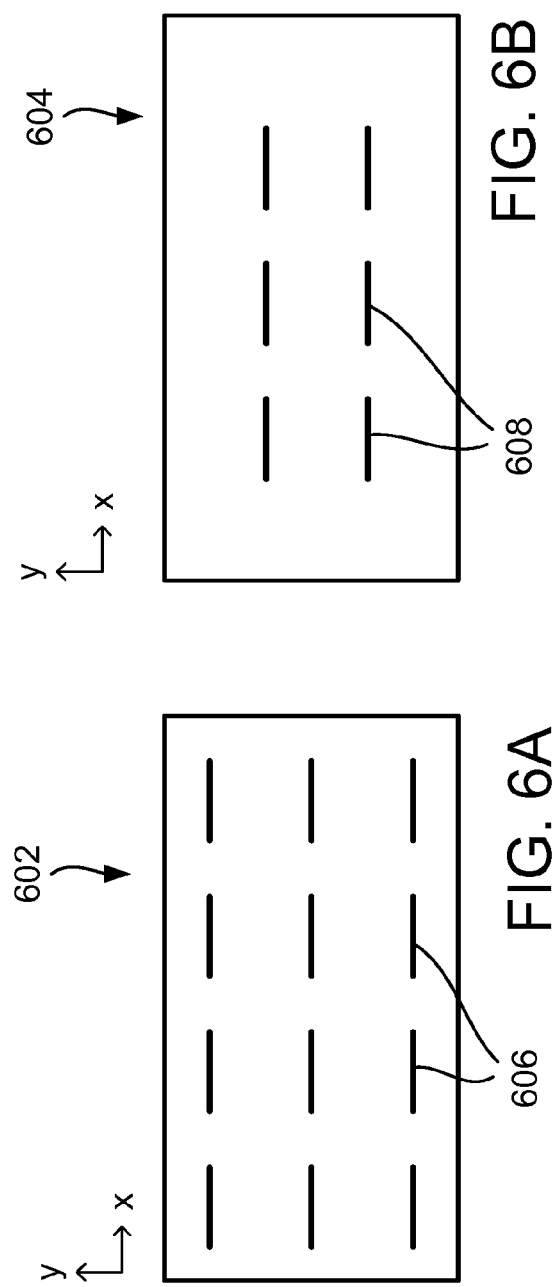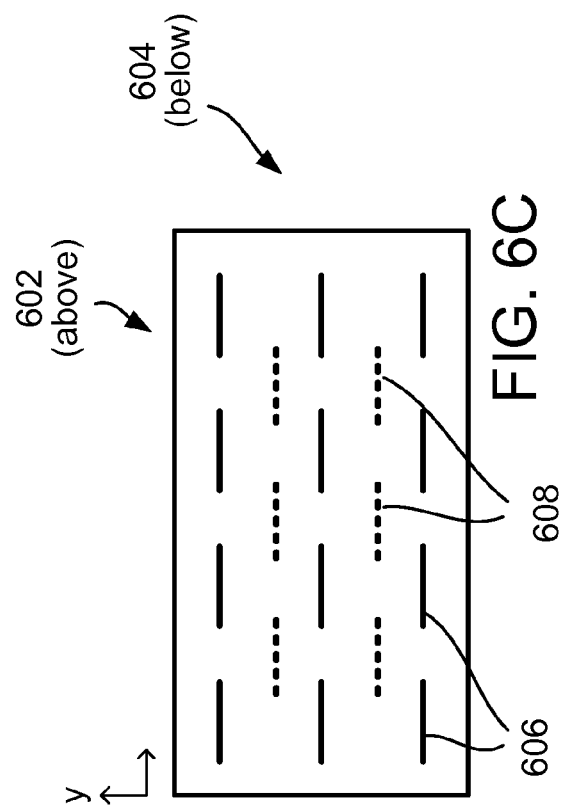

CAPACITIVE SENSORS HAVING TEMPERATURE STABLE OUTPUT

This patent application is a national phase filing under section 371 of PCT/EP2019/060675, filed Apr. 25, 2019, which claims the priority of U.S. provisional application 62/756,725, filed Nov. 7, 2018, and also claims the priority of U.S. provisional application 62/662,366, filed Apr. 25, 2018, each of which is incorporated herein by reference in its entirety.

TECHNICAL FIELD

The disclosure relates to capacitive sensor having temperature stable output.

BACKGROUND

Microelectromechanical system (MEMS) sensors can be used to measure the properties of an environment. As an example, a MEMS sensor can determine an ambient air pressure in an environment.

SUMMARY

An integrated circuit (IC) device can include an integrated sensor that measures the properties of the environment based on changes in capacitance between two electrodes. As an example, a pressure sensor can include a flexible membrane, and a hermetically sealed cavity having a known air pressure (e.g., a reference or gauge pressure) positioned on one side of the flexible membrane. The opposing side of the flexible membrane is exposed to the environment, and is subject to an ambient air pressure of the environment. The flexible membrane deflects to varying degrees based on the difference in pressure across its two sides. This degree of deflection of the membrane can be determined by measuring the capacitance between a measurement electrode embedded in the membrane and a base electrode positioned in proximity to the membrane (e.g., along the opposing side of the cavity). Based on this measurement, the sensor can determine the ambient pressure of the environment.

As the output of the sensor depends on the measured capacitance between the base electrode and the measurement electrode, electrical interference to the sensor can diminish the accuracy and/or reliability of its measurements. This electrical interference can be reduced by including a shield layer (e.g., an aluminum plate) between the sensor and sources of electrical interference (e.g., other components of the IC device).

However, the inclusion of large metal plates sometimes can impact the accuracy and/or reliability of the sensor adversely during repetitive temperature cycles. For instance, changes in temperature can induce plastic deformation in the metal plate, resulting in temperature-dependent output drift in the sensor and/or cracks or fractures in the IC device. Further, changes in temperature can alter the mechanical stress of the metal plates, and can cause a temperature-dependent output drift in the sensor. Further, the sensor's output may exhibit temperature-dependent hysteresis.

These effects can be mitigated using a variety of techniques. In some embodiments, the performance of the sensor can be improved by reducing the amount of metal in the CMOS back end that undergoes plastic deformation. As an example, this can be achieved by reducing the amount of metal in the shield plate. As another example, the mechanical stress in the shield plate can be reduced, such that the shield plate exhibits a lesser degree of plastic deformation in response to temperature changes. As another example, certain materials that are less prone to temperature-induced plastic deformation (e.g., titanium, titanium nitride, or copper) can be used in the shield plate. As another example the Coefficient of Thermal Expansion of the shield layer can be reduced in order to have lower thermal induced stress changes. As another example, the IC device can be designed such that the use of certain materials (e.g., aluminum) is minimized or otherwise reduced in proximity to the sensor. Accordingly, the sensor is shielded from electrical interference, while behaving more stably and reliably despite changes in temperature.

In an embodiment, a system includes a sensor. The sensor includes a base having a base electrode, and a first membrane suspended above the base. The first membrane includes a first membrane electrode. The first membrane is configured to deflect with respect to the base electrode in response to an environmental condition. The sensor is operable to measure a capacitance between the base electrode and the first membrane electrode. The system also includes a first electrically conductive shield layer positioned between the sensor and a device of the system operable to generate electrical interference signals. The first electrically conductive shield layer defines a plurality of first apertures extending through the first electrically conductive shield layer. The system also includes dielectric material disposed in the plurality of first apertures.

Implementations of this embodiment can include one or more of the following features.

In some implementations, a length of the first membrane in a first direction can be greater than a length of the first membrane in a second direction orthogonal to the first direction. Each aperture of the plurality of apertures can have a length in the first direction greater than a length of the aperture in the second direction.

In some implementations, the first electrically conductive shield layer can include a plurality of electrically conductive elements arranged in a grid. The plurality of electrically conductive elements can be electrically interconnected to each other.

In some implementations, the system can further include a second electrically conductive shield layer positioned between the sensor and the additional device. The second electrically conductive shield layer can define a plurality of second apertures extending through the second electrically conductive shield layer. Dielectric material can be disposed in the plurality of second apertures. The plurality of first apertures can define a first pattern with respect to the first electrically conductive shield layer. The plurality of second apertures can define a second pattern with respect to the second electrically conductive shield layer, the second pattern being different from the first pattern.

In some cases, the plurality of first apertures can define a first pattern with respect to the first electrically conductive shield layer. The plurality of second apertures can define a second pattern with respect to the second electrically conductive shield layer, at least a portion of the first pattern being geometrically similar to at least a portion of the second pattern. The second pattern can be spatially offset from the first pattern.

In some implementations, the first electrically conductive shield layer can include a plurality of parallel first electrically conductive segments. The first electrically conductive segments can be electrically interconnected by a plurality of parallel second electrically conductive segments perpendicular to the plurality of first electrically conductive segments. A length of the first membrane in a first direction can be greater than a length of the first membrane in a second direction orthogonal to the first direction. Each first electrically conductive segment of the plurality of first electrically conductive segments can have a length in the first direction greater than a length of the first electrically conductive segment in the second direction. The length of each first electrically conductive segment of the plurality of first electrically conductive segments in the second direction can be less than 3 times a thickness of the first electrically conductive shield layer in a third direction orthogonal to the first direction and the second direction.

In some implementations, the length of each first electrically conductive segment of the plurality of first electrically conductive segments in the second direction can be less than a thickness of the first electrically conductive shield layer in a third direction orthogonal to the first direction and the second direction.

In some implementations, in cross-section, an area of the plurality of first apertures can be between 40% and 90% of a total area of the plurality of the first electrically conductive shield layer.

In some implementations, the first electrically conductive shield layer can have a thickness of less than 0.8 µm.

In some implementations, the first electrically conductive shield layer can include aluminum.

In some implementations, the first electrically conductive shield layer can further include a doping material. The doping material can be at least one of copper, scandium, or praseodymium.

In some implementations, the first electrically conductive shield layer can include at least one of titanium, titanium nitride, or copper.

In some implementations, the first electrically conductive shield layer can be positioned between the sensor and a plurality of devices operable to generate electrical interference is signals. The sensor can be operable to switch off at least one of the plurality of devices when measuring the capacitance between the base electrode and the first membrane electrode.

In some implementations, the first environment condition can be a pressure in an environment of the system.

In some implementations, the first membrane and the base can define a first cavity.

In some implementations, the sensor can be a differential pressure sensor.

In some implementations, the sensor can be a microelectromechanical sensor.

In some implementations, the sensor can be a capacitive pressure sensor integrated on top of a CMOS read-out circuit.

In some implementations, the sensor can be a capacitive pressure sensor MEMS element bonded to a CMOS read-out circuit.

In some implementations, the system can further include an additional layer comprising a pattern of metal routing. The first electrically conductive shield layer can be positioned between the sensor and the additional layer. The first electrically conductive shield layer can define a pattern overlapping the pattern of metal routing.

In another embodiment, a host device includes a sensor. The sensor includes a base having a base electrode, and a membrane suspended above the base. The membrane includes a membrane electrode. The membrane is configured to deflect with respect to the base electrode in response to an environmental condition. The host device also includes an electronic control device coupled to the base electrode and the membrane electrode. The electronic control device is operable to measure a capacitance between the base electrode and the membrane electrode, and generate data indicative of the environmental condition based on the measured capacitance. The host device also includes an additional device operable to generate electrical interference signals, and an electrically conductive shield layer positioned between the sensor and the additional device. The electrically conductive shield layer defines a plurality of apertures extending through the electrically conductive shield layer. The host device also includes dielectric material disposed in the plurality of apertures, one or more processors operable to receive the data indicative of the environment condition from the electronic control device, and one or more display devices operable to present the data indicative of the environment to a user.

Implementations of this embodiment can include one or more of the following features.

In some implementations, the host device can be a mobile device.

In some implementations, the host device can be at least one of a smartphone, a tablet computer, or a wearable device.

BRIEF DESCRIPTION OF THE DRAWINGS

The details of one or more implementations are set forth in the accompanying drawings and the description below. Other features and advantages will be apparent from the description and drawings, and from the claims.

FIGS. 6A-6C are schematic diagrams showing plan views of additional example patterned shield layers.

DETAILED DESCRIPTION OF ILLUSTRATIVE EMBODIMENTS

Figure 1A:
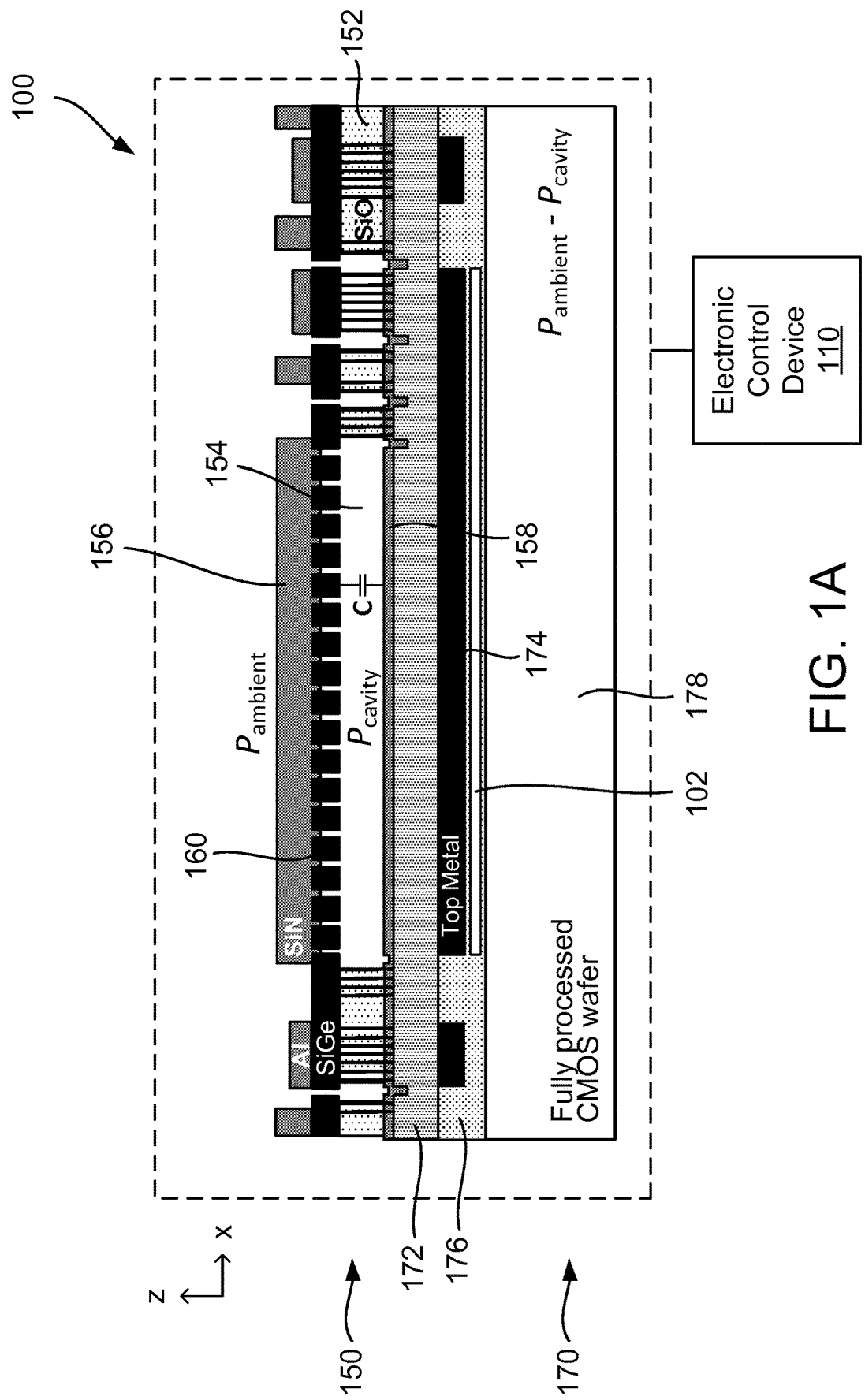
FIG. 1A is a schematic diagram showing a cross-sectional view of an example IC device.

Example sensors with temperature stable sensor output are described herein.

In some embodiments, an integrated circuit (IC) device includes an integrated sensor for measuring the properties of an environment. For instance, an IC device can be fabricated by forming one or more patterned layers of material atop a semiconductor wafer to define one or more electronic circuits (e.g., using a complementary metal-oxide-semiconductor [CMOS] fabrication process). Further, a MEMS sensor can be fabricated onto the top of the IC device (e.g., on top of the CMOS "back end") to measure the properties of the environment, generate electrical signals based on the measurements, and provide the electrical signal to the IC device for further processing.

In some implementations, an integrated sensor can measure the properties of the environment based on changes in capacitance between two electrodes. As an example, a pressure sensor can include a flexible membrane, and a hermetically sealed cavity having a known air pressure (e.g., a reference or gauge pressure) positioned on one side of the flexible membrane. The opposing side of the flexible membrane is exposed to the environment, and is subject to an ambient air pressure of the environment. The flexible membrane deflects to varying degrees based on the difference in pressure across its two sides. This degree of deflection of the membrane can be determined by measuring the capacitance between a measurement electrode embedded in the membrane and a base electrode positioned in proximity to the membrane (e.g., along the opposing side of the cavity). Based on this measurement, the sensor can determine the ambient pressure of the environment.

As the output of the sensor depends on the measured capacitance between the base electrode and the measurement electrode, electrical interference to the sensor can diminish the accuracy and/or reliability of its measurements. For example, external electrical signals (e.g., signals generated by the IC device, such as clock signals) can couple capacitively to the sensor and alter the capacitance reading between its electrodes. This interference can result in incorrect measurements by the sensor, and increase the noise in the sensor's output.

This electrical interference can be reduced by including a shield layer between the sensor and sources of electrical interference (e.g., other components of the IC device). As an example, the CMOS back end can include a metal plate (e.g., an aluminum plate) positioned between the sensor and sources of electrical interference in the IC device (e.g., a clock signal generator) to minimize or otherwise reduce the capacitive coupling between them.

However, the inclusion of large metal plates in the CMOS back end sometimes can impact the accuracy and/or reliability of the sensor adversely during repetitive temperature cycles. For instance, changes in temperature can induce plastic deformation in the metal plate, resulting in cracks or fractures in the IC device. Further, changes in temperature can alter the mechanical stress of the metal plates, and can cause a temperature-dependent output drift in the sensor (e.g., due to the sensor's sensitivity to mechanical stress). Further, the sensor's output may exhibit temperature-dependent hysteresis (e.g., provide different measurements depending on whether the sensor is being heated up or cooled down).

These effects can be mitigated using a variety of techniques. In some embodiments, the performance of the sensor can be improved by reducing the amount of metal in the CMOS back end that undergoes plastic deformation. As an example, this can be achieved by reducing the amount of metal in the shield plate (e.g., by patterning the shield plate and/or reducing the thickness of the shield plate). As another example, the mechanical stress in the shield plate can be reduced, such that the shield plate exhibits a lesser degree of plastic deformation in response to temperature changes (e.g., by patterning the shield plate so that the size of the remaining metal portions are in the same order of magnitude as the thickness of the shield plate, thereby reducing the mechanical stress at the edges of the metal portions). As another example the Coefficient of Thermal Expansion of the shield layer can be reduced in order to have lower thermal induced stress changes. As another example, certain materials that are less prone to temperature-induced plastic deformation (e.g., titanium, titanium nitride, or copper) can be used in the shield plate. As another example, the IC device can be designed such that the use of certain materials (e.g., aluminum) is minimized or otherwise reduced in proximity to the sensor. Accordingly, the sensor is shielded from electrical interference, while behaving more stably and reliably despite changes in temperature.

FIG. 1A shows a cross-sectional view of an example IC device 100. The IC device 100 includes a pressure sensor 150 formed over an integrated circuit 170. In some cases, the IC device 100 can be included in a host device, such as a mobile computing device (e.g., a smartphone, a tablet computer, or a wearable device).

In this example, the integrated circuit 170 is a CMOS device, and includes a passivation layer 172, a metallization layer 174, an intermetallic dielectric (IMD) layer 176, and one or more additional layers 178 (e.g., forming a fully processed CMOS wafer with one or more electronic circuits, such as CMOS circuits or application-specific integrated circuits [ASICs]). However, in practice, the integrated circuit 170 can be any type of electronic device (e.g., a digital device, an analog device, a mixed signal device, etc.).

The sensor 150 includes a substrate 152 defining a cavity 154, and a membrane 156 suspended over the cavity 154 (e.g., defining an upper wall of the cavity 154). The cavity 154 is hermetically sealed, and has a known air pressure $P_{cavity}$ (e.g., a reference or gauge pressure). In some cases, $P_{cavity}$ can be substantially zero (e.g., a vacuum), or some other known value. The opposing side of the flexible membrane is exposed to the environment, and is subject to an ambient air pressure of the environment $P_{ambient}$.

The membrane 154 is flexible, and deflects due to pressure differences between $P_{cavity}$ and $P_{ambient}$. For example, if $P_{ambient}$ is greater than $P_{cavity}$, the membrane 156 will deflect towards the bottom of the cavity 154 (e.g., towards the integrated circuit 170 and effectively decrease the volume of the cavity 154). If $P_{ambient}$ is less than $P_{cavity}$, the membrane 156 will deflect away from the cavity 154 (e.g., away from the integrated circuit 170 and effectively increasing the volume of the cavity 154).

The degree of deflection of the membrane 156 correlates to the pressure difference between the pressure ports $P_{cavity}$ and $P_{ambient}$. For example, a greater degree of deflection correlates to a greater pressure difference between $P_{cavity}$ and $P_{ambient}$, whereas a lesser degree of deflection correlates to a smaller pressure difference between $P_{cavity}$ and $P_{ambient}$.

The degree of deflection can be measured using one or more capacitive sensors. For example, the sensor 150 can include one or more base electrodes 158 positioned along the bottom of the cavity 154, and one or more measurement electrodes 160 positioned on or embedded in the membrane 156. The capacitance C between the base electrodes 158 and 160 depends on the distance between the base electrode(s) 158 and measurement electrode(s) 160. Accordingly, the degree of deflection of the membrane 156 can be ascertained by measuring the capacitance C.

Further, the measured capacitance C can be used to determine $P_{ambient}$. For example, the relationship between the measured capacitance C (corresponding to the degree of deflection of the membrane 156) and pressure differential between $P_{cavity}$ and $P_{ambient}$ can be determined empirically (e.g., by applying known pressures $P_{cavity}$ and $P_{ambient}$ and determining the resulting degree of deflection of the membrane 156). Subsequently, this relationship can be used (e.g., by the IC device and/or the electronic control device 110) to determine an unknown $P_{ambient}$ (e.g., by measuring the capacitance C, and determining the corresponding $P_{ambient}$ given a known $P_{cavity}$).

In some cases, measurements from the sensor 150 can be processed using an electronic control device 110. For example, the electronic control device 110 can retrieve data records describing a known relationship between a measured capacitance C, $P_{ambient}$, and $P_{cavity}$ (e.g., in the form of one or more look up tables, equations, calibration parameters, etc.). Further, the electronic control device 110 can receive data indicating the measured capacitance C. Using this information, the electronic control device 110 can calculate $P_{ambient}$ given a measured capacitance C and a known $P_{cavity}$.

In some cases, a sensor 150 includes multiple sets of membranes, cavities, base electrodes, and measurement electrodes. This can be useful, for instance, as it enables a sensor to obtain multiple different measurements concurrently. In some cases, each set of membranes, cavities, base electrodes, and measurement electrodes can be similar or substantially identical to one another. For example, the sensor 150 can include a second set of membranes, cavities, base electrodes, and measurement electrodes positioned next to the membrane 160, cavity 154, base electrode(s) 158, and measurement electrode(s) 160 (e.g., in a direction further into the page, from the cross-sectional perspective of FIG. 1A).

The output of the sensor 150 depends on the measured capacitance C between the base electrode(s) 158 and the measurement electrode(s) 154. Thus, electrical interference to the sensor 150 can diminish the accuracy and/or reliability of its measurements. For example, external electrical signals (e.g., signals generated by the integrated circuit 170, such as clock signals) can capacitively couple to the sensor 150 and alter the capacitance reading between the base electrode(s) 158 and the measurement electrode(s) 160. This interference can result in incorrect measurements by the sensor 150, and increase the noise in the sensor's output.

This electrical interference can be reduced by including an electrically conductive shield layer between the sensor 150 and sources of electrical interference (e.g., other components of the IC device 100). As an example, as shown in FIG. 1A, the CMOS back end can include a shield layer 102 (e.g., a metal plate, such as an aluminum plate) positioned between the sensor 150 and sources of electrical interference in the IC device 100 (e.g., electrical circuits in the layers 178, such as a clock signal generator). Further, the electric potential of the shield layer 102 can be biased to the same electrical potential as the base electrode(s) 158. This can be beneficial, for example, in shielding the sensor 150 from electrical interference from the integrated circuit 170, while minimizing or otherwise reducing parasitic capacitances caused by the shield layer 102.

Figure 1B:
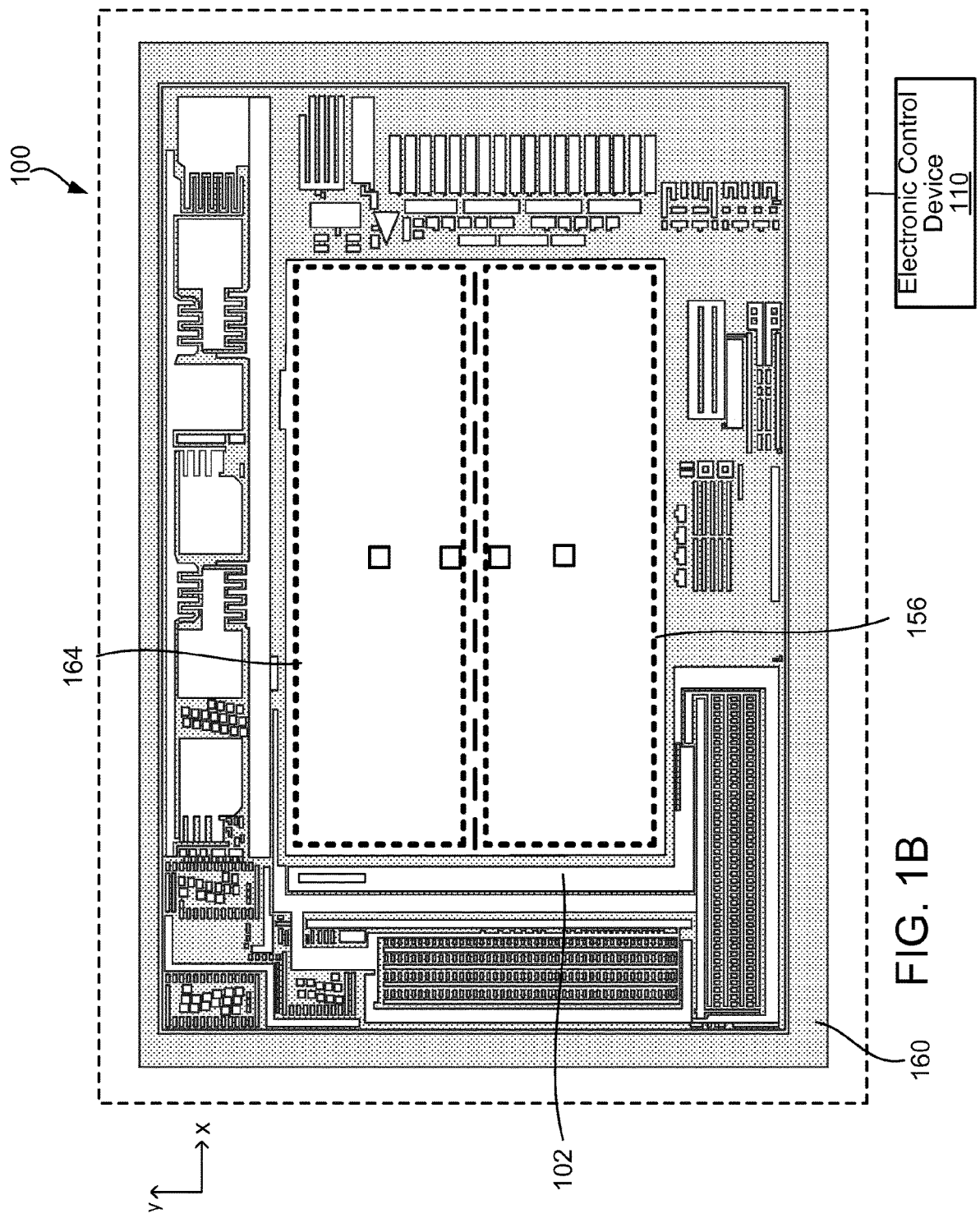
FIG. 1B is a schematic diagram showing a plan view of the IC device shown in FIG. 1A.

FIG. 1B shows a plan view of the IC device 100 shown in FIG. 1A, including the shield layer 102. In FIG. 1B, the shield layer 102 is depicted as the inner lighter-shaded rectangular region, and the underlying integrated circuit 170 is depicted as the surrounding darker-shaded rectangular region. For ease of illustration, the sensor 150 has been omitted from FIG. 1B. However, the position of the membrane 156 and a second membrane 164 (e.g., a membrane from a second set of membranes, cavities, base electrodes, and measurement electrodes for obtaining a second pressure measurement) are indicated in dotted lines. As shown in FIGS. 1A and 1B, the shield layer 102 is positioned between the sensor 150 (including the base electrodes and the measurement electrodes) and the integrated circuit 170, such that the electrical interference (e.g., capacitive coupling) between them is minimized or otherwise reduced.

However, the shield layer 102 sometimes can impact the accuracy and/or reliability of the sensor 150 adversely during repetitive temperature cycles. For instance, changes in temperature can induce plastic deformation in the shield layer 102, resulting in cracks or fractures in the IC device 100. Further, changes in temperature can alter the mechanical stress of the shield layer 102, and can cause a temperature-dependent output drift in the sensor 150 (e.g., due to the sensor's sensitivity to mechanical stress and/or displacement of the base electrodes and the measurement electrodes).

Figure 2:
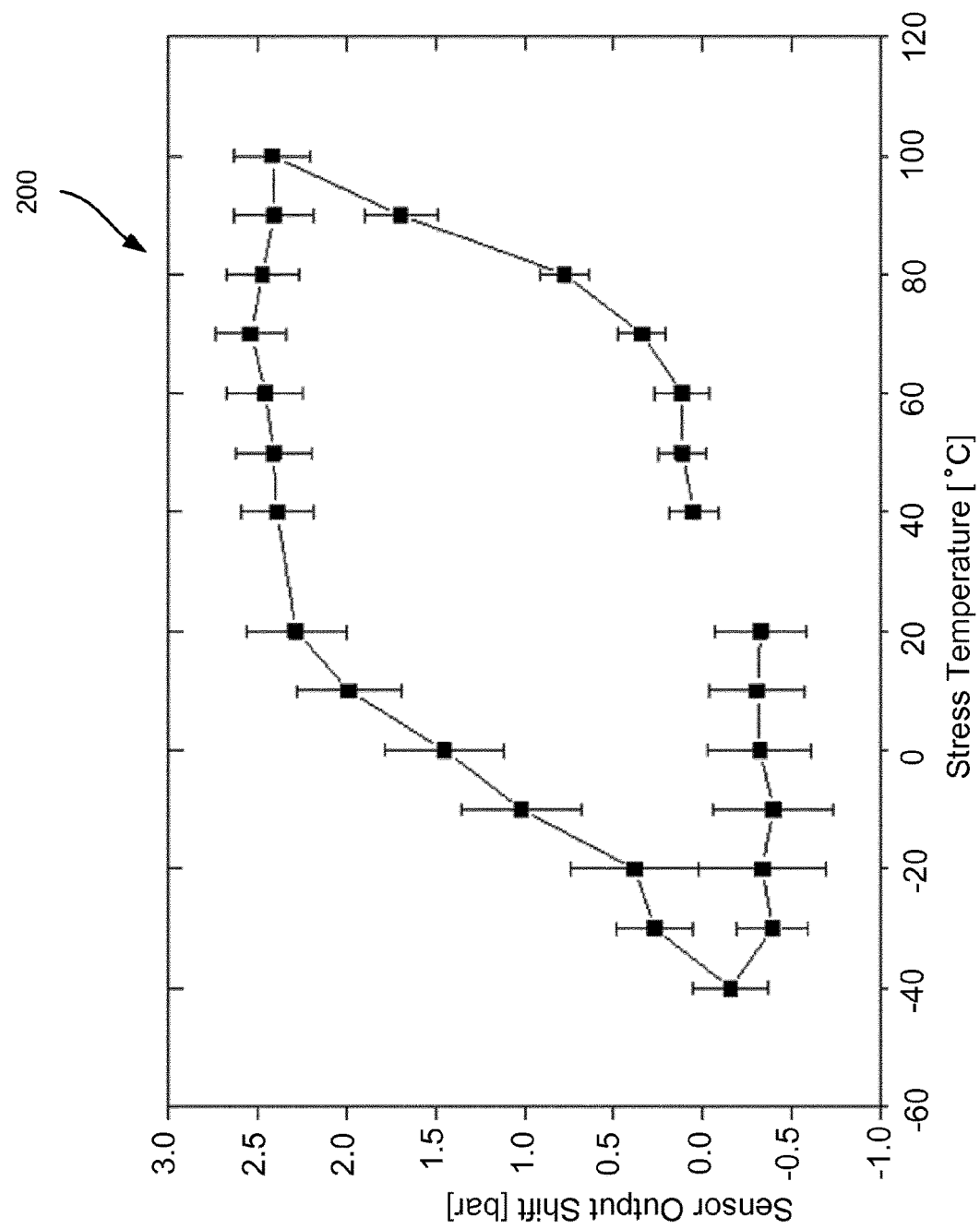
FIG. 2 is a plot of an example output of a sensor.

Further, the output of the sensor 150 may exhibit temperature-dependent hysteresis. To illustrate, FIG. 2 shows a plot 200 representing an aggregated output sequence of 20 example sensors 150. Error bars indicate the variation in output between the 20 sensors 150. In this example, constant pressures are applied as $P_{cavity}$ and $P_{ambient}$, and the ambient temperature of the sensor 150 is cycled higher (e.g., from 40° C. to 100° C.), then lower (e.g., from 100° C. to −40° C.), and then higher again (e.g., from −40° C. to 20° C.). As shown in FIG. 2, the output of the output of the sensors 150 (e.g., as indicated in the vertical axis) depends not only on the temperature of the sensors 150, but also the previous temperature state of the sensors 150 (e.g., depending on whether the sensor is being heated up or cooled down).

These effects can, in some instances, be attributed to the use of aluminum in the IC device 100. For instance, the upper metal layers of the CMOS back end sometimes are made of aluminum, which has a relatively high coefficient of temperature expansion (e.g., approximately $20 \times 10^{-6}$ $K^{-1}$) and a relatively low plastic yield strength for compressive and tensile stress (e.g., in the order of 100 MPa). Further, the yield strength of thin film aluminum can vary significantly between differently deposited films. The high coefficient of temperature expansion and the low yield strength of aluminum can cause plastic deformation in the aluminum by temperature induced stress changes. As an example, the temperature induced mechanical stress, $\sigma$, can be estimated according to the following equation:

$$\sigma = \text{Young's modulus} * (CTE_{plate} - CTE_{substrate}) * \text{Temperature change,}$$

where $CTE_{plate}$ is the coefficient of temperature expansion of the shield plate material, and $CTE_{substrate}$ is the coefficient of temperature expansion of the substrate material (e.g., the liminate, carrier, and/or silicon die). In some cases, the temperature induced mechanical stress, $\sigma$, can be approximated according to the following equation:

$$\sigma = \text{Young's modulus} * CTE_{Plate} * \text{Temperature change.}$$

For instance, assuming a Young's modulus of thin film aluminum of around 70 GPa, the plastic yield strength is reached for a temperature change of 70 K. Hence, plastic deformation in aluminum is already reached for relatively small temperature cycles. This deformation can cause drift in integrated devices that are sensitive to mechanical stress changes.

These effects can be mitigated using a variety of techniques. In some embodiments, the performance of the sensor can be improved by reducing the amount of metal in the CMOS back end that undergoes plastic deformation. As an example, this can be achieved by reducing the amount of metal in the shield plate (e.g., by patterning the shield plate and/or reducing the thickness of the shield plate). As another example, the mechanical stress in the shield plate can be reduced, such that the shield plate exhibits a lesser degree of plastic deformation in response to temperature changes (e.g., by patterning the shield plate so that the size of the remaining metal portions are in the same order of magnitude as the thickness of the shield plate, thereby reducing the mechanical stress at the edges of the metal portions). As another example, certain materials that are less prone to temperature-induced plastic deformation (e.g., titanium or titanium nitride) can be used in the shield plate. As another example, the IC device can be designed such that the use of certain materials (e.g., aluminum) is minimized or otherwise reduced in proximity to the sensor. Accordingly, the sensor is shielded from electrical interference, while behaving more stably and reliably despite changes in temperature.

Figure 3A:
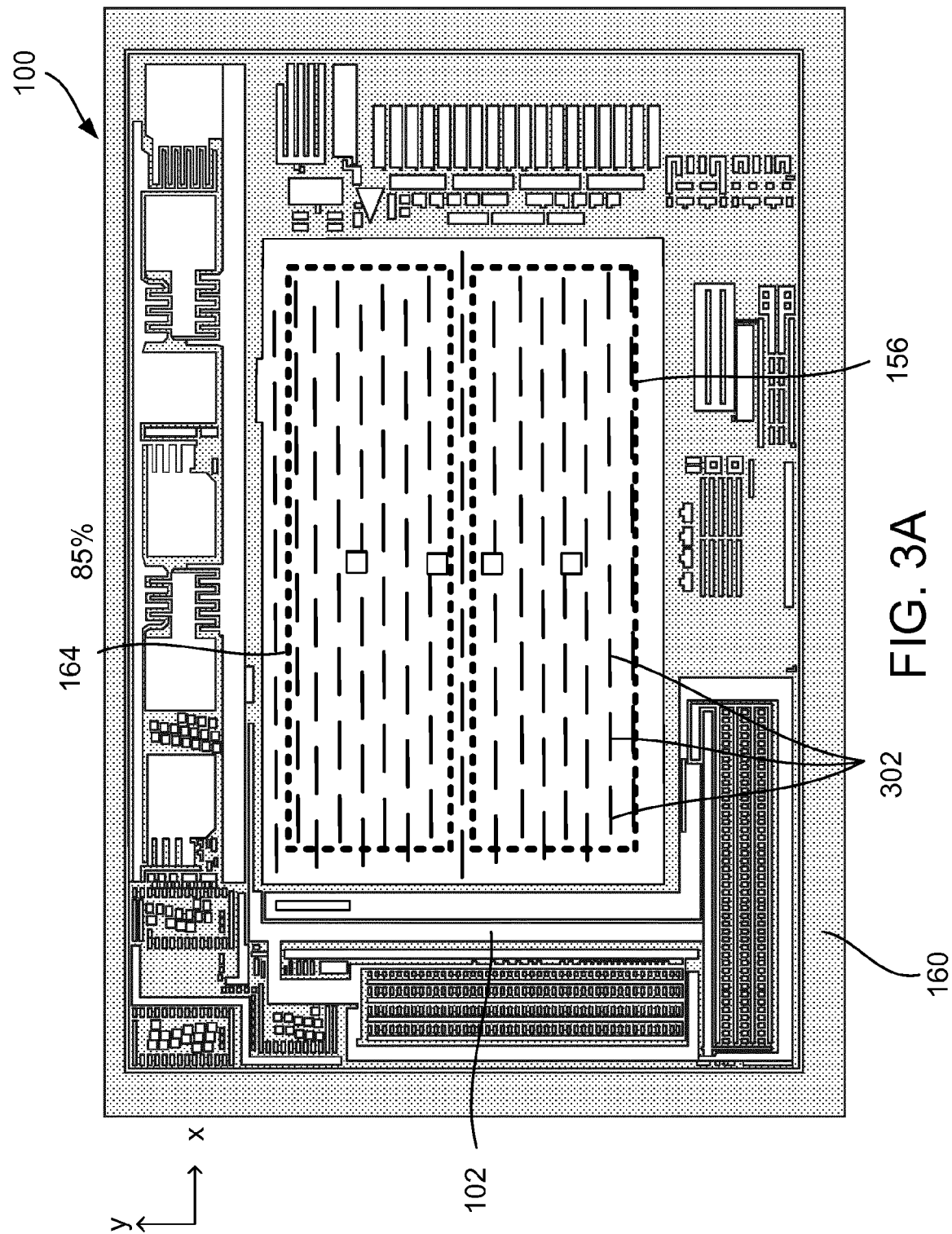
FIGS. 3A-3C are schematic diagrams showing plan views of example patterned shield layers.

FIG. 3A shows a plan view of an example IC device 100 having a patterned shield layer 102. As with FIG. 1B, in FIG. 3A, the shield layer 102 is depicted as the inner lighter-shaded rectangular region, and the underlying integrated circuit 170 is depicted as the surrounding darker-shaded rectangular region. Similarly, for ease of illustration, the sensor 150 has been omitted from FIG. 3A. However, the position of the membrane 156 and a second membrane 164 are indicated in dotted lines.

In this example, the membranes 156 and 164 are substantially rectangular in shape. For example, each membrane 156 and 164 has a length along the x-direction greater than a width along the y-direction (e.g., according to a Cartesian coordinate system, where the x-direction is orthogonal to the y-direction). Further, the shield layer 102 defines several apertures 302 (e.g., slots extending through the shield layer 102), each extending along the x-direction (e.g., such that each aperture 302 has a length along the x-direction greater than a width along the y-direction). An aperture can be, for example, a volume in which there is no electrically conductive material, such as metal. One or more of the apertures can be filled, at least in part, with a dielectric material (e.g., $SiO_2$, undoped silicate glass [USG], phosphosilicate glass [PSG], fluorosilicate glass [FSG], high density plasma [HDP] oxide, plasma-enhanced chemical vapor deposition [PECVD] SiN, PECVD $SiO_2$ or other dielectric material).

This configuration can provide a variety of benefits. For instance, rectangular membranes are predominantly sensitive to stress in the direction of its shorter side (e.g., in the y-direction). Accordingly, stress variations in the membranes due to plastic deformation of the shield layer 102 can be mitigated by orienting the apertures along the orthogonal direction (e.g., such that the apertures 302 extend in the x-direction). Further, as the shield layer 102 defines several apertures 302 corresponding to an absence of material, the amount of material used in the shield layer 102 is reduced (e.g., compared to a shield layer 102 without any apertures). Accordingly, the patterned shield layer 102 continues to mitigate the effects of electrical interference, while reducing temperature-based hysteresis (e.g., by reducing the amount of material prone to plastic deformation).

Figure 3B:
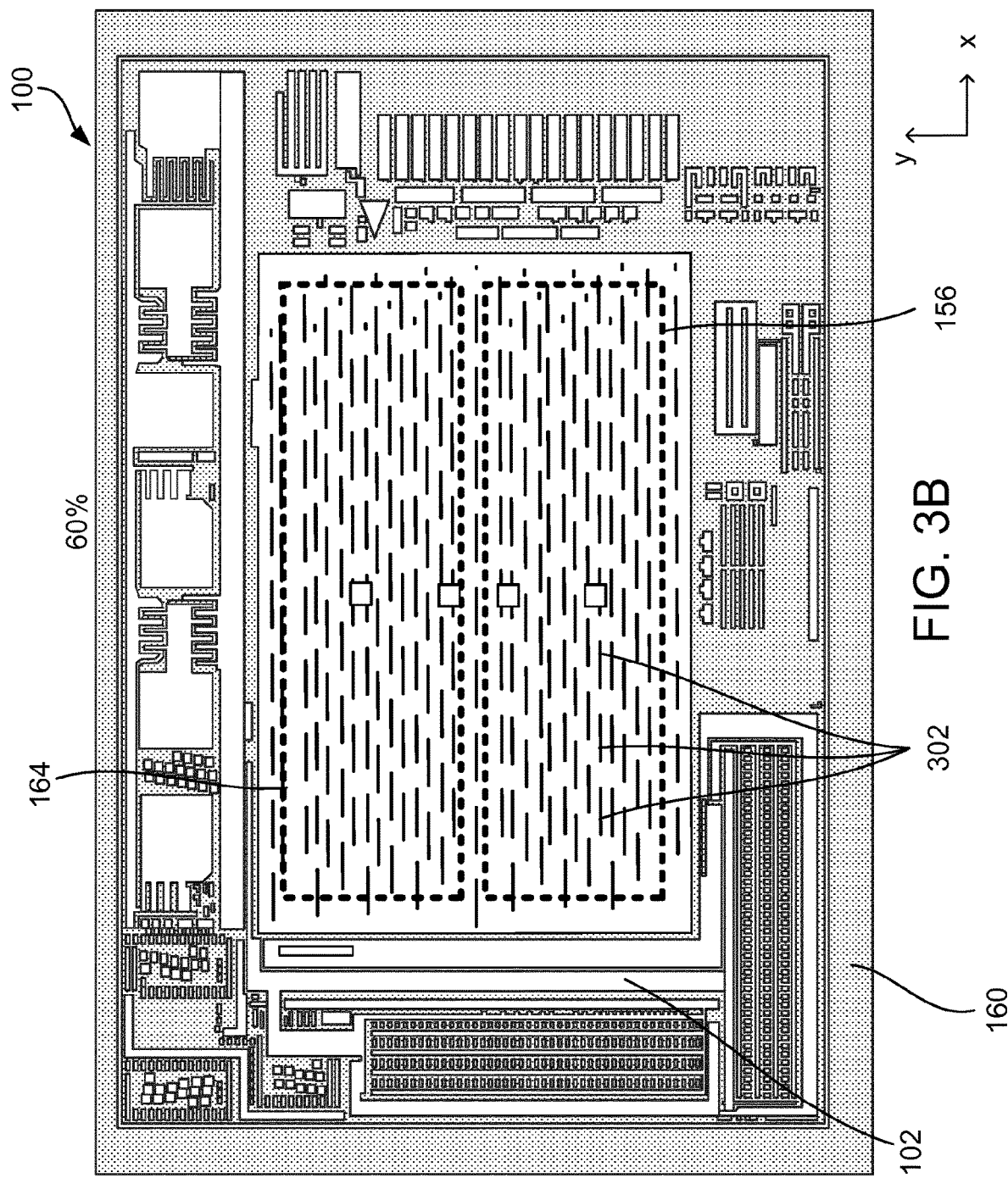

The density of the apertures pattern with respect to the shield layer 102 can vary, depending on the implementation. For instance, in the example shown in FIG. 3A, the apertures 302 occupy 15% of the total surface area of the shield layer 102. Accordingly, 85% of the surface area of the shield layer 102 is an electrically conductive material (e.g., metal), while 15% of the surface area of the shield layer 102 is an aperture (e.g., a region having an absence of electrically conductive material, and filled, at least in part, with a dielectric material, such as $SiO_2$, undoped silicate glass [USG], phosphosilicate glass [PSG], fluorosilicate glass [FSG], high density plasma [HDP] oxide, plasma-enhanced chemical vapor deposition [PECVD] SiN, PECVD $SiO_2$ or other dielectric material). These percentages can vary, depending on the implementation. For example, as shown in FIG. 3B, the density of the aperture pattern with respect to the shield layer 102 can be increased, such that 60% of the surface area of the shield layer 102 is an electrically conductive material, while 40% of the surface area of the shield layer 102 is an aperture (e.g., to reduce further the amount of material used in the shield layer 102). In some cases, the density of the aperture pattern can be specified such that 10% to 50% of the surface area of the shield layer 102 is an electrically conductive material, while 50% to 90% of the surface area of the shield layer 102 is an aperture. In some cases, the density of the aperture pattern can be specified such that 20% to 30% of the surface area of the shield layer 102 is an electrically conductive material, while 70% to 80% of the surface area of the shield layer 102 is an aperture. In practice, other percentages are also possible, depending on the implementation.

The pattern of the apertures 302 on the shield layer 102 can also vary, depending on the implementation. In some cases, the apertures 302 can be defined on the shield layer 102 in a regular or recurring pattern. In some cases, the apertures 302 can be defined on the shield layer 102 as an irregular pattern (e.g., randomly, or according to an arbitrary pattern). In some cases, the apertures 302 can be arranged according to one or more rows and/or columns (e.g., some or all of the apertures 302 can be aligned according to the x-direction and/or the y-direction). As an example, as shown in FIG. 3C, a shield layer 102 can define a series of evenly spaced parallel apertures 302 that extend along the x-direction.

The dimensions of each aperture 302 also can vary, depending on the implementation. In some cases, one or more of the apertures 302 can differ in length along the x-direction and/or width along the y-direction compared to one or more of the other apertures 302. In some cases, each of the apertures 302 can have the same length along the x-direction and/or width along the y-direction. In some cases, the width of an aperture along its shorter dimension (e.g., in the y-direction in FIGS. 3A-3C) can be less than 3 times the length of the aperture along its longer dimension (e.g., in the x-direction). In some cases, the width of an aperture along its shorter dimension can be less than 2 times the length of the aperture along its longer dimension. In some cases, the width of an aperture along its shorter dimension can be less than the length of the aperture along its longer dimension. In some cases, the width of an aperture along its shorter dimension can be between 0.5 to 3 times the length of the aperture along its longer dimension. In some cases, the thickness of the shield layer 102 can be 0.8 μm or less (e.g., in the case of an aluminum shield layer).

Figure 3C:
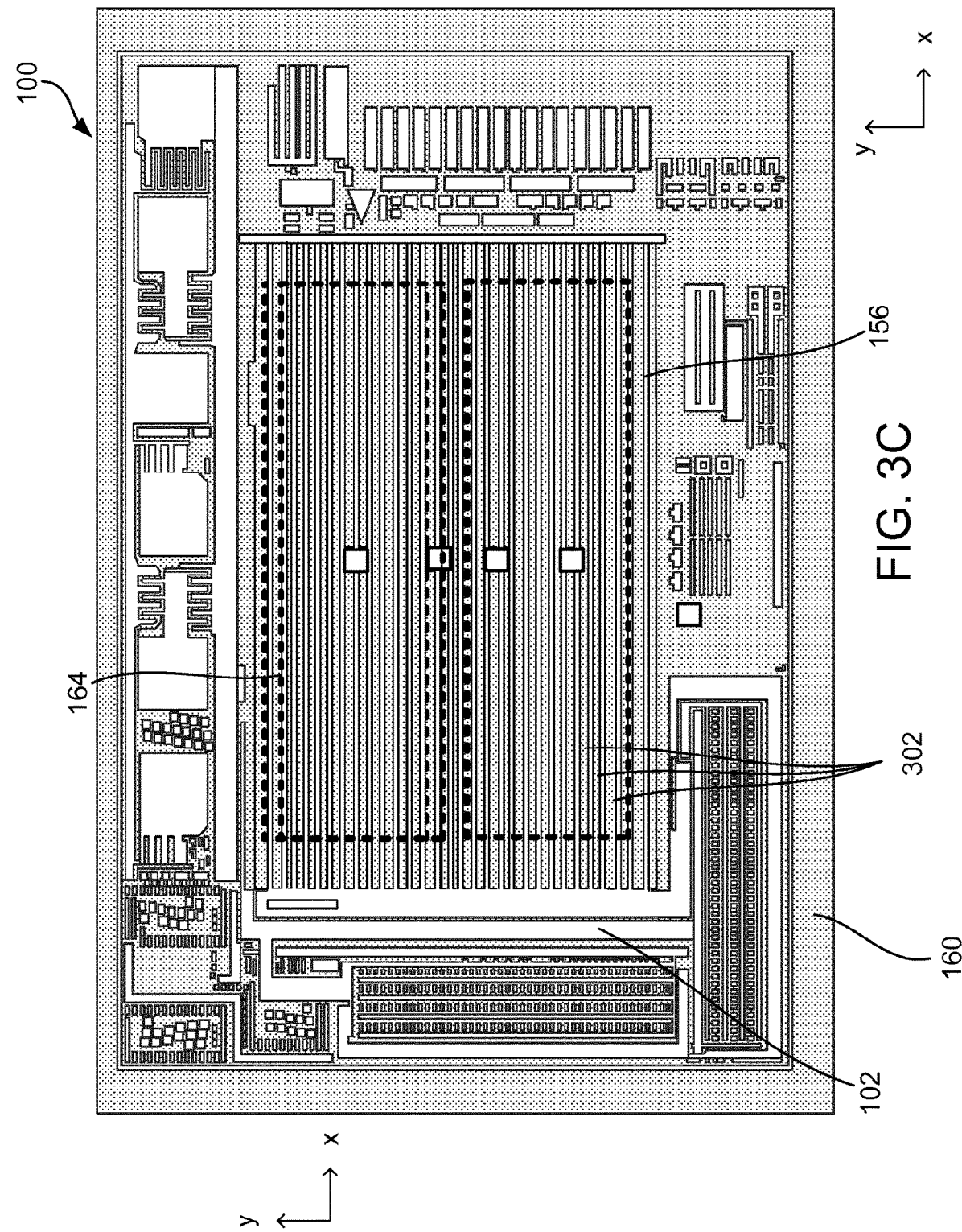

Further, the width of an aperture along its shorter dimension can be on the order of the thickness of the aperture (e.g., in the z-direction in FIGS. 3A-3C). For instance, the width of the aperture along its shorter dimension can be approximately the same as the thickness of the aperture. In some cases, the width of an aperture along its shorter dimension can be between 0.5 to 3 times the thickness of the shield layer 102. In some cases, the thickness of the shield layer 102 can be 0.8 μm or less (e.g., in the case of an aluminum shield layer). Further, if the width of the aperture is directed along the x direction, the impact on the stress change in the pressure sensitive membrane can be reduced.

Figure 4A:
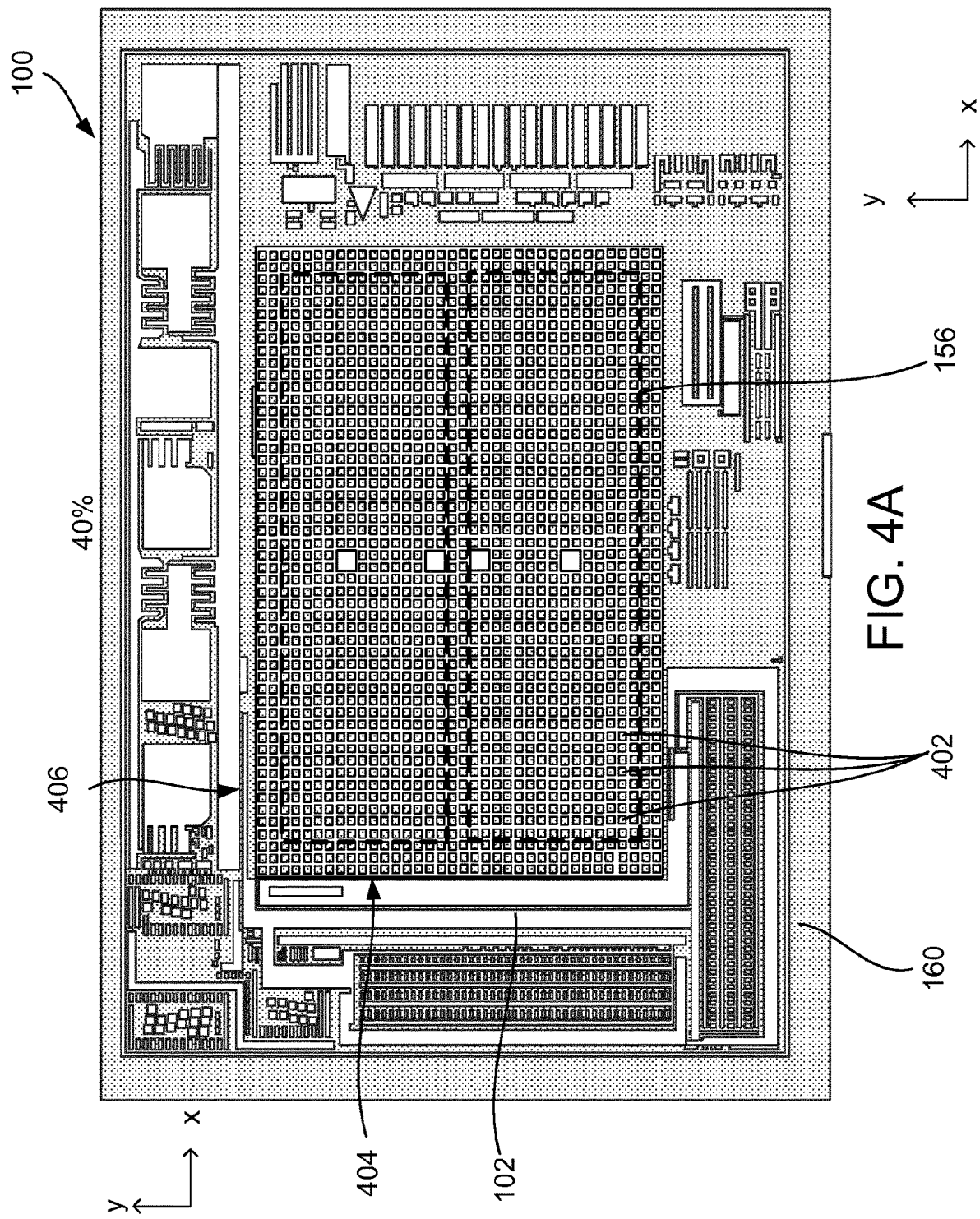
FIGS. 4A and 4B are schematic diagrams showing plan views of additional example patterned shield layers.

In the examples shown in FIGS. 3A-3C, the shield layers 102 define apertures in the form of parallel apertures. However, other patterns of apertures also can be used, either instead of or in addition to parallel apertures. As an example, FIG. 4A shows a plan view of an example IC device 100 having a patterned shield layer 102. As with FIG. 1B, in FIG. 4A, the shield layer 102 is depicted as the inner lighter-shaded rectangular region, and the underlying integrated circuit 170 is depicted as the surrounding darker-shaded rectangular region. Similarly, for ease of illustration, the sensor 150 has been omitted from FIG. 4A. However, the position of the membrane 156 and a second membrane 164 are indicated in dotted lines.

In this example, the shield layer 102 defines several square or rectangular apertures 402 extending through the shield layer 102. The apertures 402 are arranged in a grid pattern (e.g., aligned in a series of rows and columns), and are vertically separated by horizontally extending lines of material 404 (e.g., metal) and horizontally separated by vertically extending lines of material 406 (e.g., metal). Each of the lines 404 and 406 can be coupled electrically to one another (e.g., using conductive interconnects or vias positioned below the shield layer 102) such that they have the substantially same electric potential. In some cases, the lines 404 and 406 can be biased such that they have substantially the same electric potential as the base electrode(s) 158 of the sensor 150. One or more of the apertures 402 can be filled, at least in part, with a dielectric material (e.g., $SiO_2$, undoped silicate glass [USG], phosphosilicate glass [PSG], fluorosilicate glass [FSG], high density plasma [HDP] oxide, plasma-enhanced chemical vapor deposition [PECVD] SiN, PECVD $SiO_2$ or other dielectric material).

Different grid pattern configurations can be used, depending on the implementation. For example, a grid pattern can include apertures 402 having any particular shape (e.g., square, rectangle, circular, oval, triangle, or any other shape). Further, a grid pattern can include one or more apertures having shapes that are different from those of one or more other apertures. As another example, the dimensions of the apertures 402, the lines 404, and/or the lines 406 can differ, depending on the implementation. For instance, in some cases, the width of a line 404 or 406 along its shorter dimension (e.g., in the y-direction and the x-direction, respectively, in FIGS. 4A-4B) can be less than 3 times the thickness of the shield layer 102 (e.g., in the z-direction). In some cases, the width of a line 404 or 406 along its shorter dimension can be less than 2 times the thickness of the shield layer 102. In some cases, the width of a line 404 or 406 along its shorter dimension can be less than the thickness of the shield layer 102. In some cases, the width of an aperture along its shorter dimension can be on the order of the thickness of the aperture (e.g., in the z-direction in FIGS. 3A-3C). In some cases, the width of a line 404 or 406 along its shorter dimension can be between 0.5 to 3 times the thickness of the shield layer 102. In some cases, the thickness of the shield layer 102 can be 0.8 μm or less (e.g., in the case of an aluminum shield layer).

Figure 4B:
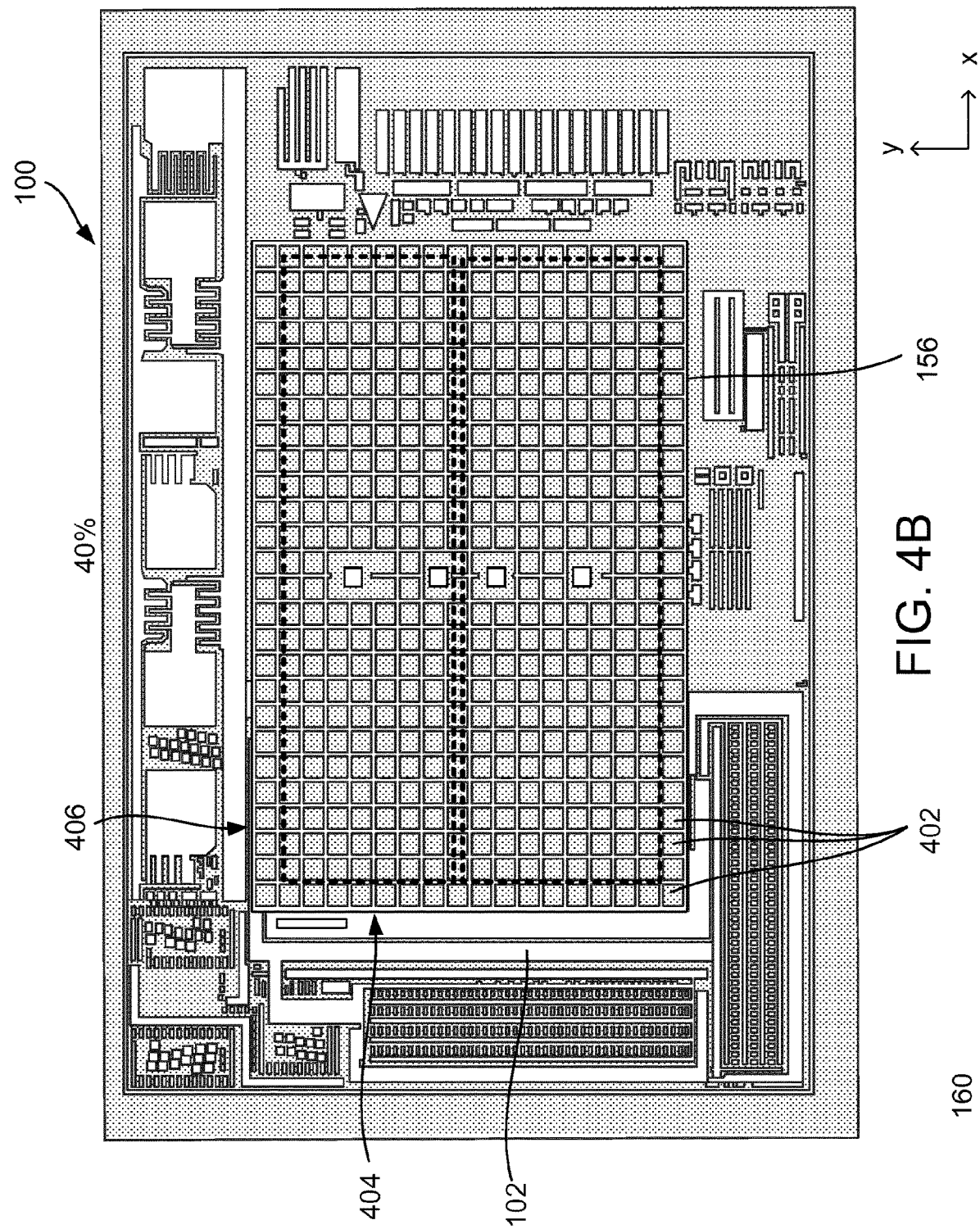

Further, the density of the aperture pattern with respect to the shield layer 102 can vary, depending on the implementation. For instance, in the example shown in FIG. 4A, the apertures 402 occupy 60% of the total surface area of the shield layer 102. Accordingly, 40% of the surface area of the shield layer 102 is an electrically conductive material (e.g., metal), while 60% of the surface area of the shield layer 102 is an aperture. These percentages can vary, depending on the implementation. For example, as shown in FIG. 4B, the density of the aperture pattern with respect to the shield layer 102 can be increased, such that 20% of the surface area of the shield layer 102 is an electrically conductive material, while 80% of the surface area of the shield layer 102 is an aperture (e.g., to further reduce the amount of material used in the shield layer 102). In some cases, the density of the aperture pattern can be specified such that 10% to 50% of the surface area of the shield layer 102 is an electrically conductive material, while 50% to 90% of the surface area of the shield layer 102 is an aperture. In some cases, the density of the aperture pattern can be specified such that 20% to 30% of the surface area of the shield layer 102 is an electrically conductive material, while 70% to 80% of the surface area of the shield layer 102 is an aperture. In practice, other percentages are also possible, depending on the implementation.

Figure 5A:
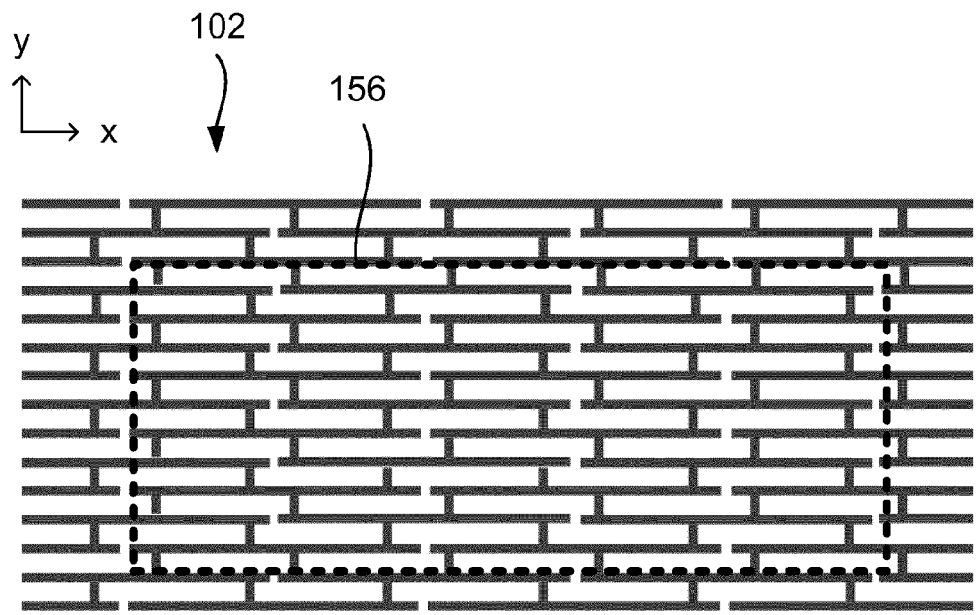
FIGS. 5A and 5B are schematic diagrams showing plan views of additional example patterned shield layers.
Figure 5B:
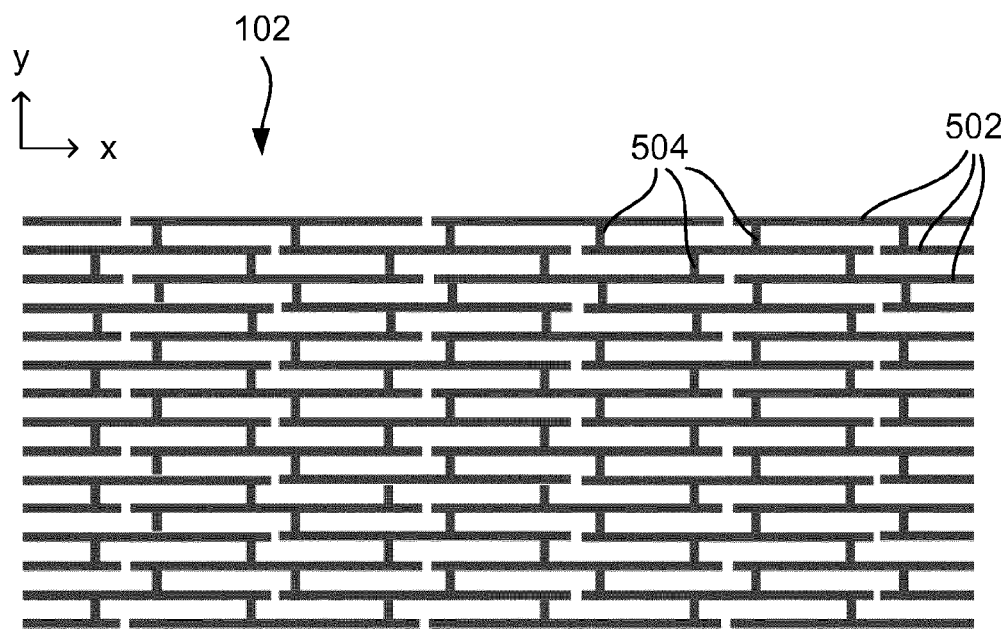

Other patterns for a shield layer 102 are also possible. For example, FIG. 5A shows a portion of a patterned shield layer 102, with the positon of a membrane 156 indicated in dotted lines. For clarity, the same portion of the shield layer 102 is shown in FIG. 5B, without the overlaid position of the membrane 156 overlaid.

In this example, the shield layer 102 includes several parallel horizontal shield elements 502 extending in the x-direction (e.g., such that its length in the x-direction is greater than its width in the y-direction). Further, the horizontal shield elements 502 are interconnected through several parallel vertical shield elements 504 extending the y-direction (e.g., such that its width in the y-direction is greater than its length in the x-direction), forming a "brick"-like pattern of apertures. Further, each of the horizontal shield elements 504 defining or more apertures 506. In this configuration, each of the horizontal shield elements 502 and 504 is interconnected with one or more other shield elements, forming a single electrically conductive element having substantially the same electric potential throughout. In some cases, the interconnected horizontal shield elements 502 and vertical shield elements 504 can be biased such that they have substantially the same electric potential as the base electrode(s) 158 of the sensor 150. One or more of the apertures 506 can be filled, at least in part, with a dielectric material (e.g., $SiO_2$, undoped silicate glass [USG], phosphosilicate glass [PSG], fluorosilicate glass [FSG], high density plasma [HDP] oxide, plasma-enhanced chemical vapor deposition [PECVD] SiN, PECVD $SiO_2$ or other dielectric material).

The dimensions of each horizontal shield element 502 and vertical shield element 504 can vary, depending on the implementation. For example, one or more of the horizontal shield elements 502 and/or vertical shield element 504 can differ in length along the x-direction and/or width along the y-direction compared to one or more of the other horizontal shield elements 502 and/or vertical shield elements 504. As another example, each of the horizontal shield elements 502 and/or vertical shield elements 504 can have the same length along the x-direction and/or width along the y-direction. In some cases, the width of a horizontal shield element 502 along its shorter dimension (e.g., in the y-direction in FIGS. 5A-5B) can be less than 3 times the thickness of the shield layer 102 (e.g., in the z-direction). In some cases, the width of a horizontal shield element 502 along its shorter dimension can be less than 2 times the thickness of the shield layer 102. In some cases, the width of a horizontal shield element 502 along its shorter dimension can be less than the thickness of the shield layer 102. In some cases, the width of a horizontal shield element 502 along its shorter dimension can be between 0.5 to 3 times the thickness of the shield layer 102. In some cases, the thickness of the shield layer 102 can be 0.8 μm or less (e.g., in the case of an aluminum shield layer).

In some cases, the width of each horizontal shield element 502 along the y-direction can be substantially smaller than its length along the x direction. In some cases, the vertical separation between adjacent horizontal shield elements 502 (e.g., among the x direction) can be between 0.8 and 1 μm. This can be beneficial, for example, in suppressing viscoelastic relaxation of the material of the shield layer in that direction. Nevertheless, in some cases, the vertical separation can be larger (e.g., between 1 and 5 μm).

Further, the density of the aperture pattern with respect to the shield layer 102 can vary, depending on the implementation. In some cases, the density of the aperture pattern can be specified such that 10% to 50% of the surface area of the shield layer 102 is an electrically conductive material (e.g., horizontal shield elements and vertical shield elements), while 50% to 90% of the surface area of the shield layer 102 is an aperture. In some cases, the density of the aperture pattern can be specified such that 20% to 30% of the surface area of the shield layer 102 is an electrically conductive material, while 70% to 80% of the surface area of the shield layer 102 is an aperture. In practice, other percentages are also possible, depending on the implementation.

In the examples of FIGS. 3A-3C, 4A-4B and 5A-5B, a single shield layer 102 is used to reduce electrical interference to a sensor. However, in some cases, a device can include multiple shield layers to reduce electrical interference to a sensor (e.g., one or more shield layers overlaid on top of one another in a stack). As an example, FIG. 6A shows a plan view of an example first patterned shield layer 602, and FIG. 6B shows a plan view of an example second patterned shield layer 604. The shield layer 602 defines a pattern of apertures 606 extending through the shield layer 602. Similarly, the shield layer 604 defines a pattern of apertures 608 extending through the shield layer 604. One or more of the apertures 606 and/or 608 can be filled, at least in part, with a dielectric material (e.g., $SiO_2$, undoped silicate glass [USG], phosphosilicate glass [PSG], fluorosilicate glass [FSG], high density plasma [HDP] oxide, plasma-enhanced chemical vapor deposition [PECVD] SiN, PECVD $SiO_2$ or other dielectric material).

In some cases, each of two or more shield layers can define a different respective pattern of apertures. For example, as shown in FIG. 6A, the pattern of apertures 606 is different from the pattern of apertures 608. Accordingly, when the shield layer 602 is stacked on top of the shield layer 604, the apertures 606 and 608 do not align (e.g., as shown in FIG. 6C, showing a plan view of the shield layer 602 stacked on top of the shield layer 604, with the apertures 608 of the underlying shield layer 604 shown in dotted lines).

Figure 7A:
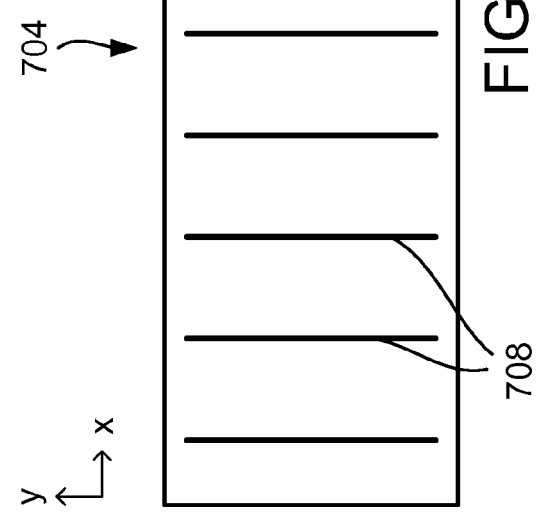
FIGS. 7A-7C are schematic diagrams showing plan views of additional example patterned shield layers.
Figure 7B:
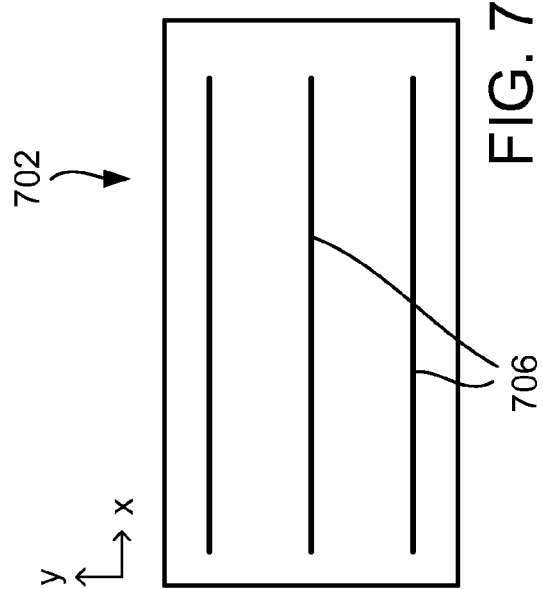
Figure 7C:
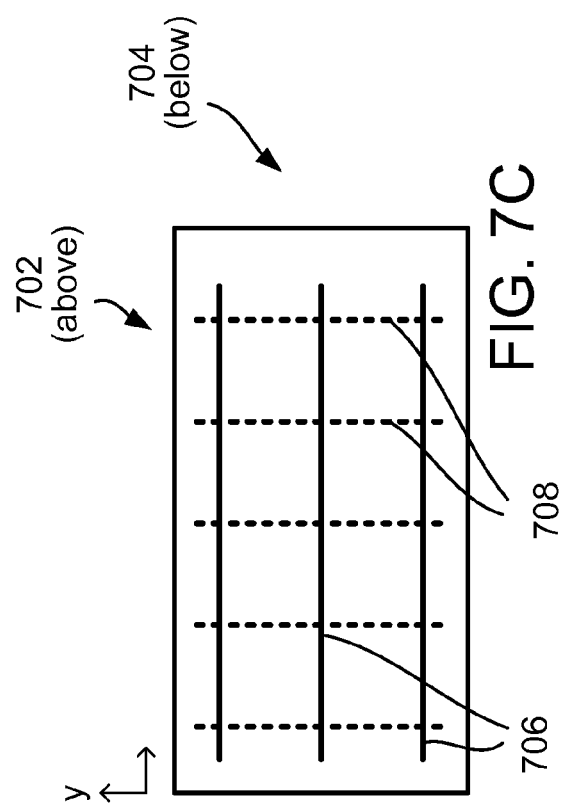

As another example, FIG. 7A shows a plan view of an example first patterned shield layer 702, and FIG. 7B shows a plan view of an example second patterned shield layer 704. The shield layer 702 defines a pattern of apertures 706 extending through the shield layer 702 (e.g., horizontal apertures), whereas the shield layer 704 defines a different pattern of apertures 708 extending through the shield layer 704 (e.g., vertical apertures). When the shield layer 702 is stacked on top of the shield layer 704, the apertures 706 and 708 do not align (e.g., as shown in FIG. 7C, showing a plan view of the shield layer 702 stacked on top of the shield layer 704, with the apertures 708 of the underlying shield layer 704 shown in dotted lines). One or more of the apertures 706 and/or 708 can be filled, at least in part, with a dielectric material (e.g., $SiO_2$, undoped silicate glass [USG], phosphosilicate glass [PSG], fluorosilicate glass [FSG], high density plasma [HDP] oxide, plasma-enhanced chemical vapor deposition [PECVD] SiN, PECVD $SiO_2$ or other dielectric material).

In some cases, each of two or more shield layers defines similar patterns of apertures (e.g., a particular recurring pattern of apertures). However, the pattern of apertures on one shield layer can be offset spatially relative to the pattern of apertures on another shield layer. For instance, the pattern on one shield layer can be spatially offset from the pattern of another shield layer by a particular length in the x-direction (e.g., shifted in the x-direction) and/or offset spatially by a particular width in the y-direction (e.g., shifted in the y-direction).

Although FIGS. 6A-6C and 7A-7C show the use of two shield layers in conjunction, in practice, any number of shield layers can be used in conjunction (e.g., one, two, three, four, or more). Further, in some cases, at least some of the shield layers can define similar patterns of apertures. Further still, in some cases, at least some of the shield layers can define different patterns of apertures from one other. In some cases, one or more shield layers can be made of aluminum. In some cases, one or more shield layers can be made of aluminum doped with a doping material. As an example, a shield layer can be doped with a quantity of copper (e.g., around 1 wt % copper) to improve mechanical strength and to reduce electro-migration. As other examples, or more shield layers can include aluminum doped with strontium and/or praseodymium, either individually or in combination with copper in improve yield strength in the shield layers.

In some cases, one or more shield layers can be made of an electrically conductive material that is less susceptible to temperature-induced plastic deformation compared to aluminum. For example, one or more shield layers can be made of titanium, titanium nitride, and/or copper. Nevertheless, in some cases, one or more shield layers can be made of aluminum.

Other modifications can also be made to the IC device to improve the performance and stability of the sensor, and to reduce temperature-dependent noise and hysteresis.

Figure 8:
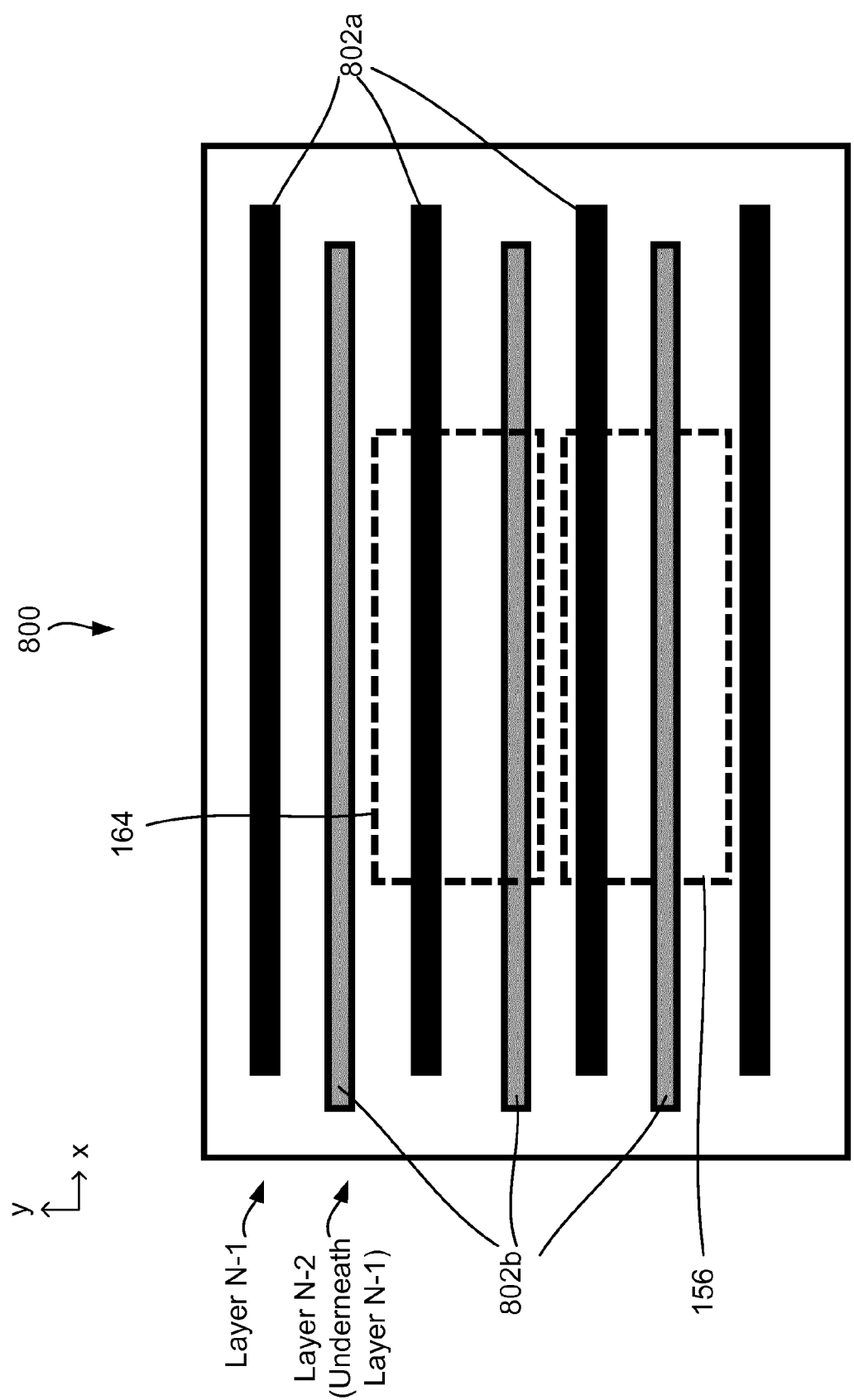
FIG. 8 is a schematic diagram showing a plan view of a CMOS back end.

In some cases, to further reduce the influence of the aluminum in the CMOS back end, the CMOS back end can be arranged such that the amount of metal that is parallel to the stress sensitive direction of the membrane (e.g., in the y-direction) is minimized or otherwise reduced. For instance, relatively large metal lines of material (e.g., power rails) can be re-positioned, to the extent possible, such that they are not parallel of the stress sensitive direction of the membrane (e.g., such that they extend in the x-direction instead). Further, if metal layers are placed in the stress sensitive direction of the membrane, they can be fabricated such that their widths are reduced. Further, these elements can be placed in lower layers of the integrated circuit (e.g., as these elements are often thinner in lower layers than in the higher metal layers). As an example, FIG. 8 shows a plan view of an example CMOS back end 800, including two adjacent metal layers N−1 and N−2. For reference, the position of the first membrane 156 and a second membrane 164 are indicated in dotted lines. Further, for ease of illustration, each of the layers of the CMOS back end 800 are illustrated as transparent layers, except for the power rails 802a on the metal layer N−1 and the power rails 802b of the metal layer N−2 (e.g., to illustrate the positions of the power rails relative to one another). As shown in FIG. 8, each of the power rails 802a and 802b are parallel to the stress insensitive direction of the membranes (e.g., parallel to the x-direction).

Although various features are described with respect to a pressure sensor herein, this is merely an illustrative example. In practice, these features can be implemented in any type of stress sensitive MEMS structures, such as absolute, gauge, and differential pressure sensors, gyroscopes, accelerometers, microphones, etc. Further, these features can be implemented on any stress sensitive transducer integrated on top of a CMOS device, a stand-alone stress sensitive transducer with an embedded shield plate underneath the sensor area, or a stress sensitive transducer bonded directed to wafer with read-out electronics.

Example Systems

Some implementations of the subject matter and operations described in this specification can be implemented in digital electronic circuitry, or in computer software, firmware, or hardware, including the structures disclosed in this specification and their structural equivalents, or in combinations of one or more of them. For example, in some implementations, one or more components of the electronic control devices 110 can be implemented using digital electronic circuitry, or in computer software, firmware, or hardware, or in combinations of one or more of them.

Some implementations described in this specification can be implemented as one or more groups or modules of digital electronic circuitry, computer software, firmware, or hardware, or in combinations of one or more of them. Although different modules can be used, each module need not be distinct, and multiple modules can be implemented on the same digital electronic circuitry, computer software, firmware, or hardware, or combination thereof.

Some implementations described in this specification can be implemented as one or more computer programs, i.e., one or more modules of computer program instructions, encoded on computer storage medium for execution by, or to control the operation of, data processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application or "app,' script, or code) can be written in any form of programming language, including compiled or interpreted languages, declarative or procedural languages. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer may also include, or be operatively coupled to receive data from or transfer data to, or both, one or more mass storage devices for storing data, e.g., magnetic, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD-ROM and DVD-ROM disks. The processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, visual, or tactile input. In addition, a computer can interact with a user by sending documents to and receiving documents from a device that is used by the user; for example, by sending webpages to a web browser on a user's client device in response to requests received from the web browser.

A computer system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other.

The IC devices described herein can be integrated into host devices such as smartphones, laptops, wearable devices, other computers, and automobiles. The host devices may include processors and other electronic components, and other supplemental modules configured to collect data (e.g., cameras, time-of-flight imagers, etc.). Other supplemental modules may be included such as ambient lighting, display screens, automotive headlamps, and the like. The host devices may further include non-volatile memory where instructions for operating the IC devices, and in some instances the supplemental modules, are stored.

The components and supplemental modules integrated into the host devices may generate electrical signals that could potentially interfere with the operation of a capacitive sensor. Further, the components and supplemental modules integrated into the host devices may generate significant heat, and may increase the operating temperature of a sensor. Further still, the host device may be subjected to a variety of different environmental conditions, including a range of different ambient temperatures.

The IC devices having one or more of the features described herein possess a significant advantage in such implementations. For example, the sensors of the IC devices are shielded from electrical interference by a patterned shield layer, thereby improving the accuracy and/or reliability of their measurements. Further, the measurements are less susceptible to variation due to changes in temperature. This can confer substantial advantages to the host devices into which these IC devices are implemented. For example, in some instances the IC devices include pressure sensors and are integrated into smartphones. Since the pressure data collected by these sensors is temperature invariant, and the pressure data is used for functions executed by the smartphones (e.g., determining an altitude of the smartphone), these functions are also likely to be temperature invariant thereby conferring substantial advantages to the smartphone itself.

Figure 9:
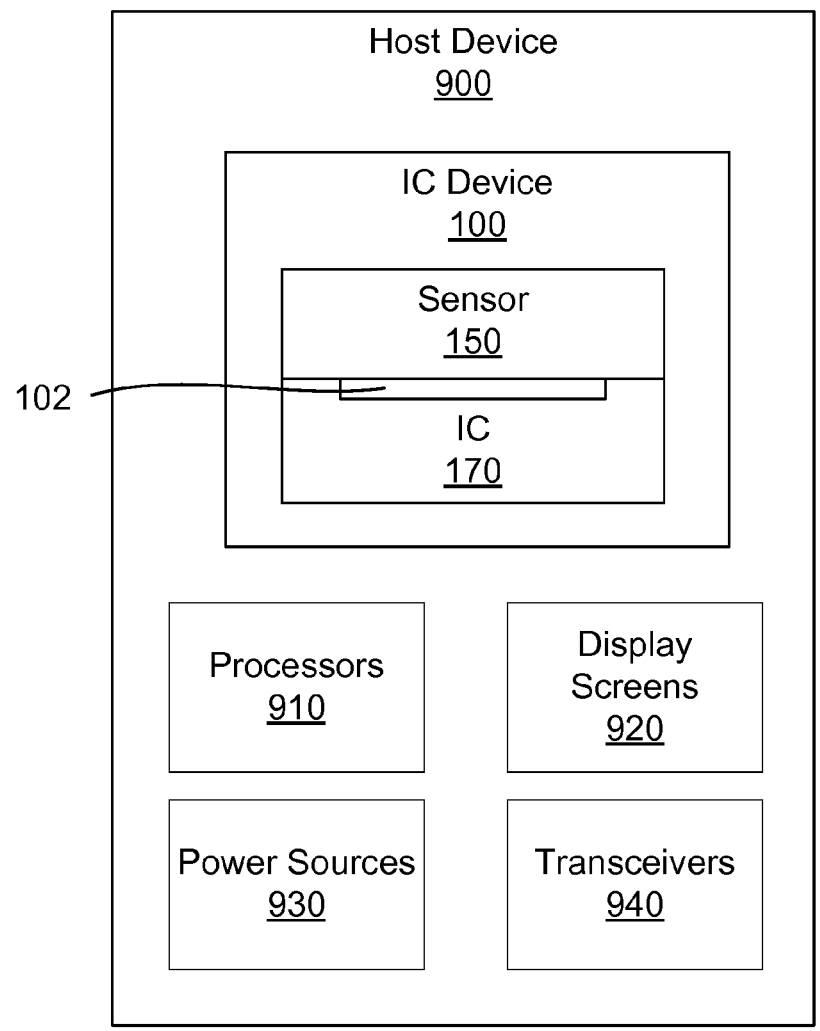
FIG. 9 is a schematic diagram of an example host device including an IC device.

As an example, FIG. 9 shows a host device 900 having an IC device 100 (including a sensor 150 and an integrated circuit 170 with a patterned shield layer 102). The host device 900 also includes several additional components, including one or more computer processors 910 (e.g., to implement the electronic control device 110), one or more display screens 920, one or more power sources 930 (e.g., batteries, charging circuits, etc.), and one or more transceivers 940 (e.g., a wireless radio, such a Wi-Fi radio, cellular radio, Bluetooth radio, etc.). During operation of the host device 900, the computer processors 910, display screens 920, power sources 930, and transceivers 940 can each generate substantial heat. Further, the environment surrounding the host device 900 (e.g., sunlight, ambient air, a user's body, etc.) can also impart additional heat to the host device 900. However, due to the patterned shield layer 102, the output of the sensor 105 is less susceptible to temperature-dependent drift and hysteresis, and thus is more accurate and reliable under a variety of different operating conditions (e.g., compared to a host device 900 without the patterned shield layer 102).

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable sub-combination.

A number of embodiments have been described. Nevertheless, various modifications may be made without departing from the spirit and scope of the invention. Accordingly, other implementations are within the scope of the claims.

What is claimed is:

1. A system comprising:
a sensor comprising:
a base having a base electrode; and
a first membrane suspended above the base, wherein the first membrane comprises a first membrane electrode, wherein the first membrane is configured to deflect with respect to the base electrode in response to an environmental condition, and wherein the sensor is configured to measure a capacitance between the base electrode and the first membrane electrode;
a first device of the system configured to generate electrical interference signals;
a first electrically conductive shield layer positioned between the sensor and the first device of the system, wherein the first electrically conductive shield layer defines a plurality of first apertures extending through the first electrically conductive shield layer; and
a dielectric material disposed in the plurality of first apertures.

2. The system of claim 1,
wherein a length of the first membrane in a first direction is greater than a length of the first membrane in a second direction orthogonal to the first direction, and
wherein each aperture of the plurality of apertures has a length in the first direction greater than a length of the aperture in the second direction.

3. The system of claim 1, wherein the first electrically conductive shield layer comprises a plurality of electrically conductive elements arranged in a grid.

4. The system of claim 3, wherein the plurality of electrically conductive elements are electrically interconnected to each other.

5. The system of claim 1, further comprising a second electrically conductive shield layer positioned between the sensor and a second device, wherein the second electrically conductive shield layer defines a plurality of second apertures extending through the second electrically conductive shield layer, and wherein a dielectric material disposed in the plurality of second apertures.

6. The system of claim 5, wherein the plurality of first apertures defines a first pattern with respect to the first electrically conductive shield layer, and wherein the plurality of second apertures defines a second pattern with respect to the second electrically conductive shield layer, the second pattern being different from the first pattern.

7. The system of claim 5, wherein the plurality of first apertures defines a first pattern with respect to the first electrically conductive shield layer, wherein the plurality of second apertures defines a second pattern with respect to the second electrically conductive shield layer, at least a portion of the first pattern being geometrically similar to at least a portion of the second pattern, and the second pattern being spatially offset from the first pattern.

8. The system of claim 1, wherein the first electrically conductive shield layer comprises a plurality of parallel first electrically conductive segments, and wherein the first electrically conductive segments are electrically interconnected by a plurality of parallel second electrically conductive segments perpendicular to the plurality of first electrically conductive segments.

9. The system of claim 8,
wherein a length of the first membrane in a first direction is greater than a length of the first membrane in a second direction orthogonal to the first direction, and
wherein each first electrically conductive segment of the plurality of first electrically conductive segments has a length in the first direction greater than a length of the first electrically conductive segment in the second direction.

10. The system of claim 9, wherein the length of each first electrically conductive segment of the plurality of first electrically conductive segments in the second direction is less than 3 times a thickness of the first electrically conductive shield layer in a third direction orthogonal to the first direction and the second direction.

11. The system of claim 9, wherein the length of each first electrically conductive segment of the plurality of first electrically conductive segments in the second direction is less than a thickness of the first electrically conductive shield layer in a third direction orthogonal to the first direction and the second direction.

12. The system of claim 1, wherein in cross-section, an area of the plurality of first apertures is between 40% and 90% of a total area of the plurality of the first electrically conductive shield layer.

13. The system of claim 1, wherein the first electrically conductive shield layer comprises aluminum and a doping material.

14. The system of claim 13, wherein the doping material is at least one of copper, scandium, or praseodymium.

15. The system of claim 1, wherein the first electrically conductive shield layer comprises at least one of titanium, titanium nitride, or copper.

16. The system of claim 1, wherein the first electrically conductive shield layer is positioned between the sensor and a plurality of devices configured to generate electrical interference signals, and wherein the sensor is configured to switch off at least one of the plurality of devices when measuring the capacitance between the base electrode and the first membrane electrode.

17. The system of claim 1, wherein the environmental condition is a pressure in an environment of the system.

18. The system of claim 1, wherein the first membrane and the base define a first cavity.

19. The system of claim 1, further comprising an additional layer comprising a pattern of metal routing,
wherein the first electrically conductive shield layer is positioned between the sensor and the additional layer, and
wherein the first electrically conductive shield layer defines a pattern overlapping a pattern of metal routing.

20. A host device comprising:
the system according to claim 1;
an electronic control device coupled to the base electrode and the first membrane electrode,
wherein the electronic control device is configured to:
measure the capacitance between the base electrode and the first membrane electrode, and
generate data indicative of the environmental condition based on the measured capacitance;
one or more processors configured to receive the data indicative of the environmental condition from the electronic control device; and
one or more display devices operable to present the data indicative of an environment to a user.

21. A system comprising:
a sensor comprising:
a base comprising a base electrode; and
a membrane suspended above the base, wherein the membrane comprises a membrane electrode, wherein the membrane is configured to deflect with respect to the base electrode in response to an environmental condition, wherein the sensor is configured to measure a capacitance between the base electrode and the membrane electrode;
a device of the system configured to generate electrical interference signals;
a first electrically conductive shield layer positioned between the sensor and the device of the system, wherein the first electrically conductive shield layer defines a plurality of first apertures extending through the first electrically conductive shield layer; and
a dielectric material disposed in the plurality of first apertures, wherein the first apertures are arranged in an area of the first electrically conductive shield layer, which overlaps with the membrane in plan view.

* * * * *